United States Patent
Sauerbrey et al.

(10) Patent No.: US 11,038,523 B2
(45) Date of Patent: Jun. 15, 2021

(54) RING OSCILLATOR-BASED ANALOG-TO-DIGITAL CONVERTER

(71) Applicant: Intel Corporation, Santa Clara, CA (US)

(72) Inventors: Jens Sauerbrey, Taufkirchen (DE); Jacinto San Pablo Garcia, Neubiberg (DE); Enara Ortega, Unterhaching (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/452,609

(22) Filed: Jun. 26, 2019

(65) Prior Publication Data

US 2020/0412376 A1    Dec. 31, 2020

(51) Int. Cl.
*H03M 3/00* (2006.01)
*H03L 7/099* (2006.01)
*H03M 1/00* (2006.01)
*H03M 1/12* (2006.01)

(52) U.S. Cl.
CPC .......... *H03M 3/464* (2013.01); *H03L 7/0996* (2013.01); *H03M 3/436* (2013.01); *H03M 1/001* (2013.01); *H03M 1/12* (2013.01); *H03M 3/30* (2013.01)

(58) Field of Classification Search
CPC ........... H03M 3/30; H03M 1/12; H03M 1/001
USPC ................................ 341/143, 155, 110, 200
See application file for complete search history.

(56) References Cited

U.S. PATENT DOCUMENTS

| 6,429,693 | B1 * | 8/2002 | Staszewski | H03L 7/085 327/12 |
| 8,564,471 | B1 * | 10/2013 | Gao | G04F 10/005 341/166 |
| 2012/0112936 | A1 * | 5/2012 | Huang | H03M 1/502 341/110 |
| 2012/0194369 | A1 * | 8/2012 | Gallon | H03M 3/388 341/120 |

(Continued)

OTHER PUBLICATIONS

M. Straayer, M. Perrott: A 12-Bit, 10 MHz bandwidth, continuous-time Sigma Delta ADC with a 5-Bit, 950-MS/s VCO-based quantizer, JSSC, pp. 805-814, 2008.

(Continued)

*Primary Examiner* — Joseph J Lauture
(74) *Attorney, Agent, or Firm* — 2SPL Patent Attorneys PartG mbB; Yong Beom Hwang

(57) ABSTRACT

A ring oscillator-based analog-to-digital converter (ADC). The ring oscillator-based ADC includes a ring oscillator and a transition detector. The ring oscillator may include a set of inverters coupled in a ring wherein an output of an inverter is coupled to an input of a successive inverter in the ring. The transition detector is configured to detect transitions of outputs of the inverters by comparing outputs of two separate inverters at two consecutive time instances. The transition detector may include two sets of registers configured to store outputs of the set of inverters at two consecutive time instances, respectively, and a set of comparators configured to compare the outputs stored in the two sets of registers. Each comparator may be configured to compare an output of one inverter at a first time instance and an output of another inverter at a second time instance.

21 Claims, 10 Drawing Sheets

(56) References Cited

U.S. PATENT DOCUMENTS

2013/0002318 A1* 1/2013 Lu ............................ H03L 7/16
327/156
2015/0061907 A1* 3/2015 Miglani .................. H03M 3/37
341/143

OTHER PUBLICATIONS

Matthew Park and Michael H. Perrott: "A 78dB SNDR 87 mW 20 MHz Bandwidth Continuous-Time ΔΣ ADC With VCO-Based Integrator and Quantizer Implemented in 0.13 μm CMOS", IEEE Journal of Solid-State Circuits, vol. 44, No. 12, Dec. 2009, pp. 3344-3358.

Hamidreza Maghami et al.: "A 0.9V, 79.7dB SNDR, 2MHz-BW, Highly linear OTA-less 1-1 MASH VCO-based ΔΣ ADC with a Novel Phase Quantization Noise Extraction Technique", 978-1-5366-9395-7/19, IEEE, 2019.

Karthikeyan Reddy et al.: "A 16-mW 78-dB SNDR 10-MHz BW CT ΔΣ ADC Using Residue-Cancelling VCO-Based Quantizer", IEEE Journal of Solid-State Circuits, vol. 47, No. 12, Dec. 2012, pp. 2916-2927.

* cited by examiner

RING OSCILLATOR-BASED ANALOG-TO-DIGITAL CONVERTER

FIELD

Examples relate to ring oscillator-based analog-to-digital converter (ADC) and a method for analog-to-digital conversion using a ring oscillator.

BACKGROUND

Sigma delta modulators are widely used for analog-to-digital (A/D) conversion and digital-to-analog (D/A) conversion, or the like. Generally, in sigma delta modulators an input signal is introduced into a loop filter, and quantized by a quantizer, and then processed through digital filters. In order to compensate for the errors a feedback signal is sent back via a digital-to-analog converter (DAC) to be subtracted from the input signal before entering the quantizer.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
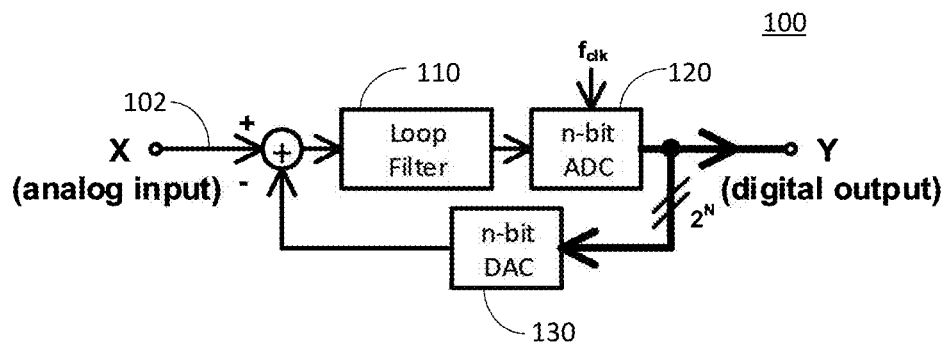
FIG. 1 is a block diagram of an exemplary sigma-delta modulator-based ADC in accordance with one example.

FIG. 1 is a block diagram of a sigma-delta modulator-based ADC 100 in accordance with one example. The sigma-delta ADC 100 includes a loop filter 110, a multi-bit ADC 120, and a multi-bit digital-to-analog converter (DAC) 130. The input analog signal 102 is filtered through the loop filter 110. The loop filter 110 provides a gain for the sigma delta modulator, which mitigates/attenuates the quantization errors in the band of interest. For example, the loop filter 110 may be an integrator (e.g. a first order or any higher order integrator). The quantization noise may be high-pass filtered and may be attenuated or shaped in the band of interest due to the gain provided by the loop filter 110.

The ADC 120 converts the loop filter output to a digital signal. The ADC 120 may be an n-bit quantizer, where n is a positive integer. The ADC 120 may have a relatively low resolution (e.g. n being 1 to 6 bits). The ADC 120 may be realized by a voltage-controlled oscillator (VCO)-based ADC. In order to compensate for the errors a feedback signal is sent back via the DAC 130 to be subtracted from the input signal by an adder 140 before entering the loop filter 110. The DAC 130 may be an n-bit DAC. The connection between the ADC 120 and the DAC 130 may be realized in a thermometer code representation of $2^N$ lines rather than in a binary weighted format. This thermometer code representation is used to drive the DAC cells inside the n-bit DAC 130, i.e. each of the ADC digital output lines drives one of the DAC cells. As the ADC 120 is inside the loop the propagation delay of the ADC 120 should be very small. Otherwise the loop stability is affected and the modulator may not work properly.

Figure 2:
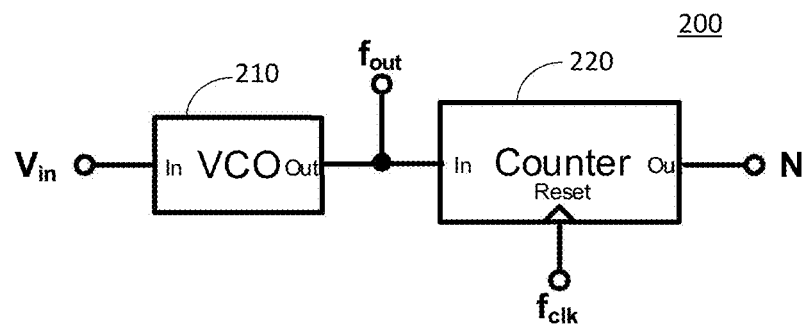
FIG. 2 shows a simplified principle of a voltage-controlled oscillator (VCO)-based ADC.

FIG. 2 shows a simplified principle of a VCO-based ADC 200. The VCO-based ADC 200 may include a VCO 210 and a counter 220. The VCO 210 is controlled by an analog input voltage $V_{in}$. The frequency of the digital VCO signal $f_{out}$ is proportional to the input voltage $V_{in}$. If the number of transitions of the digital VCO output signal during a known period of time is counted, this number is a digital representation of the analog input signal $V_{in}$. The number of transitions can be added by a counter 220 which is reset with a fixed period by the clock signal $f_{clk}$. The number N is the digital representation of the analog input signal $V_{in}$. In order to have high resolution very high oscillation frequency is needed which may result in large power consumption. Additionally, the counter 220 would add significant propagation delay which may not be acceptable inside the loop of the sigma-delta modulator.

Figure 3:
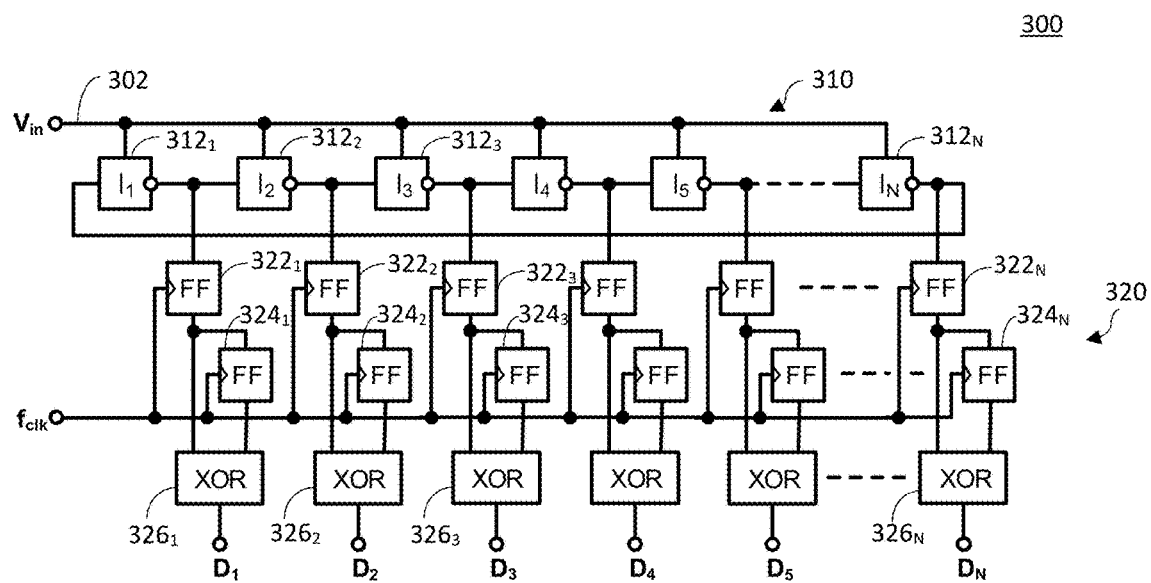
FIG. 3 shows an example ring oscillator-based ADC.

FIG. 3 shows an example ring oscillator-based ADC 300. The ring oscillator-based ADC 300 includes an N-stage ring oscillator 310 and a transition detector 320. The N-stage ring oscillator 310 includes N inverter stages $I_1 \ldots I_N$ $312_1$-$312_N$, where the speed of each stage is controlled by the analog input voltage $V_{in}$ 302. The inverters $312_1$-$312_N$ are digital inverters that transitions between logic '0' and '1' and this transition is detected by the transition detector 320 comprising two sets of registers $322_1$-$322_N$ and $324_1$-$324_N$ and a set of comparators $326_1$-$326_N$. The output of each inverter stage $312_1$-$312_N$ is tapped by a register $322_1$-$322_N$, delayed by another register $324_1$-$324_N$, and logically combined by an XOR gate $326_1$-$326_N$. The registers $322_1$-$322_N$ and $324_1$-$324_N$ are latched with the clock signal $f_{clk}$. The sum of the XOR gate output signals $D_1 \ldots D_N$ that are "1" is a digital representation of the analog input signal $V_{in}$ 302. This circuit counts the sum of all "0" to "1" and "1" to "0" transitions of the ring oscillator 310 during each cycle of $f_{clk}$. Therefore, the oscillation frequency can be much more relaxed. Furthermore, no counter is needed.

The ring oscillator-based ADC 300 in FIG. 3 requires a number of transitions between 0 and N in one clock period of $f_{clk}$. This means that the ring oscillator 310 must provide N/2 transitions at the common mode input voltage ($V_{in}$=$v_{cm}$). It needs to provide N transitions at the positive full scale voltage and provide zero transitions at the negative full scale voltage.

Figure 4:
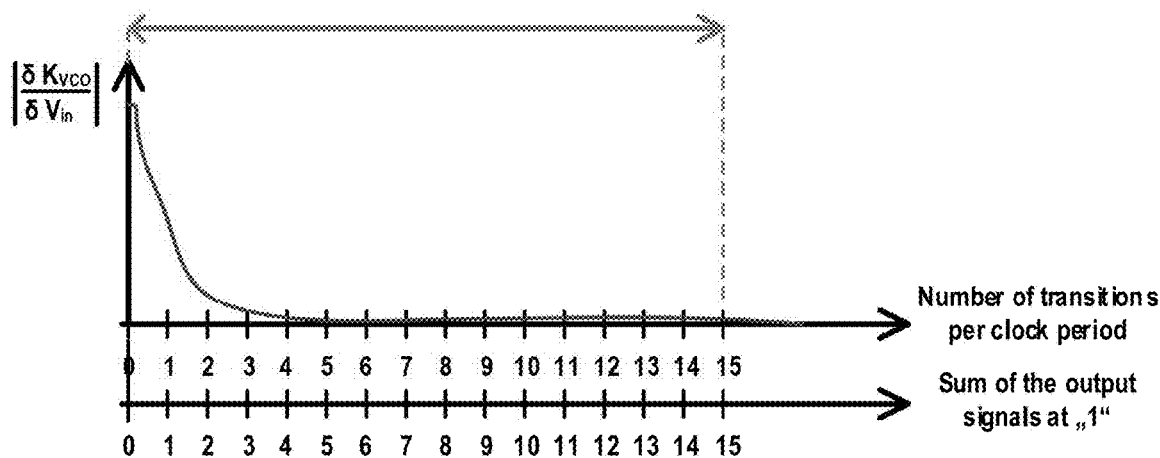
FIG. 4 shows a typical non-linearity behavior of a 15-stage ring oscillator-based VCO.

FIG. 4 shows a typical non-linearity behavior of a 15-stage ring oscillator-based VCO (e.g. the ADC 300 in FIG. 3 with N=15). The sum of the output signals at "1" in the implementation in FIG. 3 is equal to the number of VCO transitions in one clock period $f_{clk}$. Ideally the VCO frequency gain $K_{VCO}$ should be constant for all input voltages $V_{in}$. The absolute value of the deviation of $K_{VCO}$ when changing $V_{in}$, which is a measure of the VCO linearity, should be zero for all input voltages $V_{in}$. However, this is not a case in real-world circuits.

If the ring oscillator-based VCO has a high number of transitions the linearity behavior can be acceptably good by proper design. However, if the number of transitions is very low, the linearity behavior degrades drastically as shown in FIG. 4. This means that high linearity may not be achieved for all output codes, namely at the lower input voltage range where the expectation goes towards zero transitions. Using the structure in FIG. 3 typically translates into large harmonics. Alternatively, only a part of the ADC full scale range can be used, but it results in a loss of resolution.

Examples disclosed are for frequency translation techniques for a ring oscillator-based VCO. The techniques disclosed herein allow operating the ring oscillator-based VCO in a very linear range. This avoids complicated and power hungry VCO hardware or software linearization techniques. It also avoids losing dynamic range of the VCO by only using a part of the VCO signal range.

Figure 5:
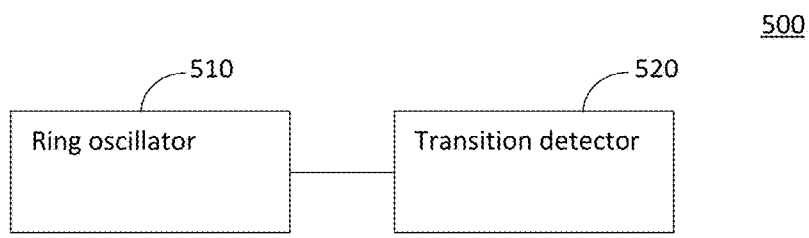
FIG. 5 shows a ring oscillator-based ADC in accordance with one example.

FIG. 5 shows a ring oscillator-based ADC 500 in accordance with one example. The ring oscillator-based ADC 500 may be used as the ADC 120 in the sigma-delta ADC 100 in FIG. 1. The ring oscillator-based ADC 500 includes a ring oscillator 510 and a transition detector 520. The ring oscillator 510 includes a set of inverters that are operably coupled in a ring wherein an output of an inverter is coupled to an input of a successive inverter in the ring. The transition detector 520 is configured to detect transitions of outputs of the inverters by comparing outputs of two separate inverters at two consecutive instances.

In one example, the transition detector 520 may include two sets of registers configured to store outputs of the set of inverters at two consecutive instances and a set of comparators configured to compare the outputs stored in the two sets of registers. Each comparator may be configured to compare an output of one inverter at a first instance and an output of another inverter at a second instance. The two inverters whose outputs are compared by each comparator may be adjacent inverters in the ring. Alternatively, the two inverters whose outputs are compared by each comparator may be separated by more than one in the ring.

Figure 6:
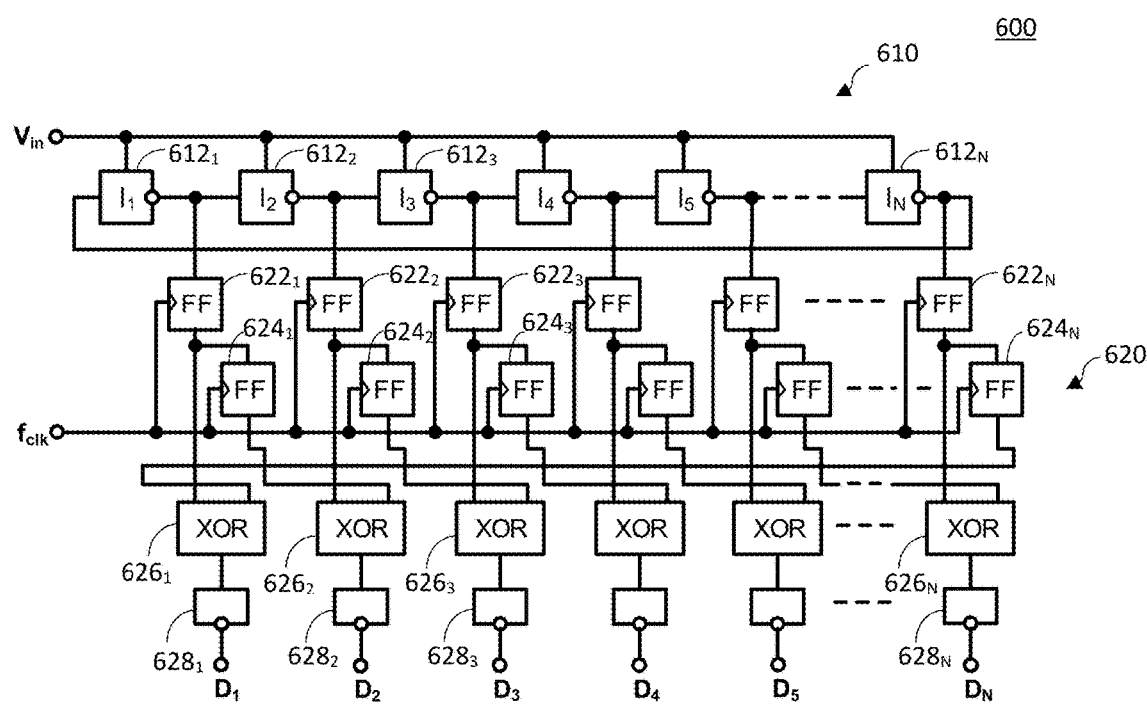
FIG. 6 shows a ring oscillator-based ADC in accordance with one example.

FIG. 6 shows a ring oscillator-based ADC 600 in accordance with one example. The ring oscillator-based ADC 600 may be used as the ADC 120 in the sigma-delta ADC 100 in FIG. 1. The ring oscillator-based ADC 600 includes a ring oscillator 610 and a transition detector 620. The ring oscillator 610 includes a set of inverters $612_1$-$612_N$ (digital inverters switching between logic '0' and '1') operably coupled in a ring such that an output of an inverter is coupled to an input of a successive inverter in the ring. The transition detector 620 is configured to detect transitions of outputs of the inverters $612_1$-$612_N$ by comparing outputs of two inverters at two consecutive time instances. The inverters $612_1$-$612_N$ may be single-ended inverters with a single input and a single output. Alternatively, the inverters $612_1$-$612_N$ may be differential inverters with differential inputs and differential outputs (i.e. two inputs of opposite polarity and two outputs of opposite polarity). Alternatively, the inverters $612_1$-$612_N$ may be differential inverters with single-ended configuration.

In one example, the transition detector 620 may include a first set of registers $622_1$-$622_N$ (e.g. flip-flops) and a second set of registers $624_1$-$624_N$ (e.g. flip-flops). The outputs of the inverters $612_1$-$612_N$ are latched (stored) to the first set of registers $622_1$-$622_N$ at a rising (or falling) edge (a first time instance) of the clock signal $f_{clk}$ and then transitioned to the second set of registers $624_1$-$624_N$ at the following rising (or falling) edge (a second time instance) of the clock signal $f_{clk}$ such that the outputs of the inverters $612_1$-$612_N$ are captured by the two sets of registers $622_1$-$622_N$ and $624_1$-$624_N$ at two consecutive time instances of the clock signal $f_{clk}$. The transition detector 620 includes a set of comparators $626_1$-$626_N$ (e.g. XOR gates) to compare the outputs stored in the two sets of registers $622_1$-$622_N$ and $624_1$-$624_N$.

One flip-flop in the first set of registers $622_1$-$622_N$ and one flip-flop in the second set of registers $624_1$-$624_N$ are connected to each one of the set of comparators $626_1$-$626_N$ (e.g. XOR gate). In examples, the two flip-flops that are coupled to each comparator are not coupled to the same inverter tap but to different inverter taps. A first input to each comparator is connected to a flip-flop in the first set of registers $622_1$-$622_N$ coupled to one inverter and a second input to that comparator is connected to a flip-flop in the second set of registers $624_1$-$624_N$ coupled to another inverter. There is at least one shift of the inputs to the comparator (e.g. an XOR gate). The shift value may be one, two, three, or any value between 1 and the number of stages N minus 1. A shift of one (1) means that the two flip-flops that are coupled to each comparator are coupled to inverters that are separated by one (1) in the ring (i.e. two neighboring inverters in the ring). A shift of two (2) means that the two flip-flops that are coupled to each comparator are coupled to inverters that are separated by two (2) in the ring (i.e. one and the next neighboring inverters in the ring).

FIG. 6 shows an example case of a shift of 1. In FIG. 6, a comparator $626_1$ is coupled to a flip-flop $622_1$ and a flip-flop $624_N$, a comparator $626_2$ is coupled to a flip-flop $622_2$ and a flip-flop $624_1$, a comparator $626_3$ is coupled to a flip-flop $622_3$ and a flip-flop $624_2$, and so on. For a shift of 1, one more transition is needed to have the same number of "1s" at the output of the comparators $626_1$-$626_N$ compared to the case without the shift. This allows to use the VCO in a more linear range. In the example shown in FIG. 6, the ring oscillator may provide N/2+1 transitions at the common mode input voltage $v_{cm}$ of $V_{in}$, provide N+1 transitions at the positive full scale voltage, and provide 1 transition at the negative full scale voltage. The circuit in FIG. 6 translates the 1 transition to 0 at the digital output and N+1 transitions to N at the digital output.

In case of odd number of shifts (e.g. shift of 1, 3, 5, . . . ), the transition detector 620 may optionally further include a set of inverters $628_1$-$628_N$. Each inverter $628_1$-$628_N$ is coupled to each comparator $626_1$-$626_N$, respectively. The additional inverters $628_1$-$628_N$ may be added to compensate the inverting behavior of the inverter-based ring oscillator structure for an odd number of shifts.

Adding inverters at all outputs is equivalent to an inversion of the output signal. Adding the inverters $628_1$-$628_N$ to the output would introduce some delay. Therefore, as an alternative to adding the inverters $628_1$-$628_N$, when the ring oscillator-based ADC is used to drive fully-differential circuits in the following stage, this inversion can be implemented by inverting the polarity of the fully-differential signals in the following stage (e.g. in the DAC 130). Therefore, adding the inverters, which would introduce some delay, can be avoided when fully differential circuit design is used with the inversion of the differential signals.

As a further alternative, the additional inverters $628_1$-$628_N$ may not be used if the delay stages in the ring oscillator 610 provide a non-inverted output, for example if fully differential inverters are used in the ring oscillator 610. A differential inverter outputs two complementary outputs (two outputs in opposite polarity). By taking a non-inverted output from the preceding inverter (in case of shift of 1), the output would be the same without the additional inverters $628_1$-$628_N$.

Figure 7:
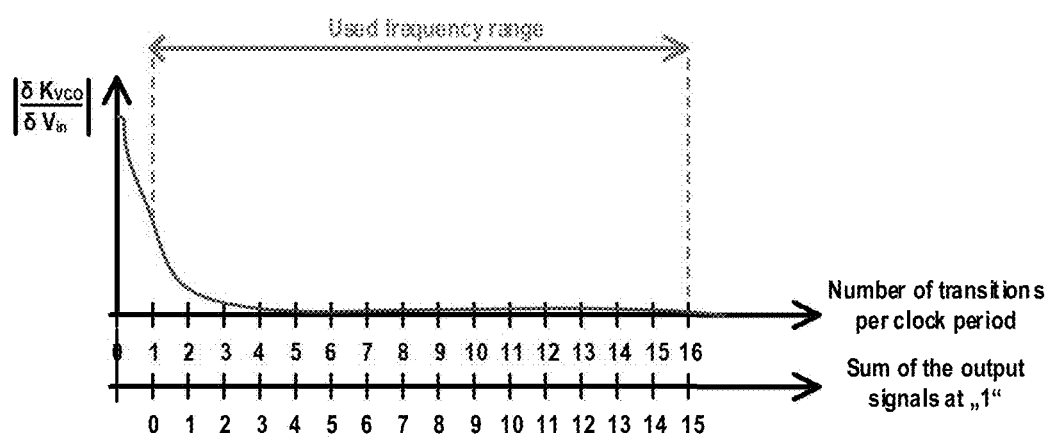
FIG. 7 shows a typical non-linearity behavior of the ring oscillator-based ADC of FIG. 6 with a shift of 1.

FIG. 7 shows a typical non-linearity behavior of the ring oscillator-based ADC 600 of FIG. 6 with a shift of 1. FIG. 7 shows that the used frequency range is shifted by 1 (i.e. 1 to 16 instead of 0 to 15). In this example, the conventional digital 0 for zero transition is no more used and the minimum number of transitions is 1, which strongly improves linearity of the ring oscillator-based ADC 600. In this example, one transition is translated to a digital 0 and 16 transitions is translated to a digital 15, and the maximum number of transitions is 16 instead of 15.

Figure 8:
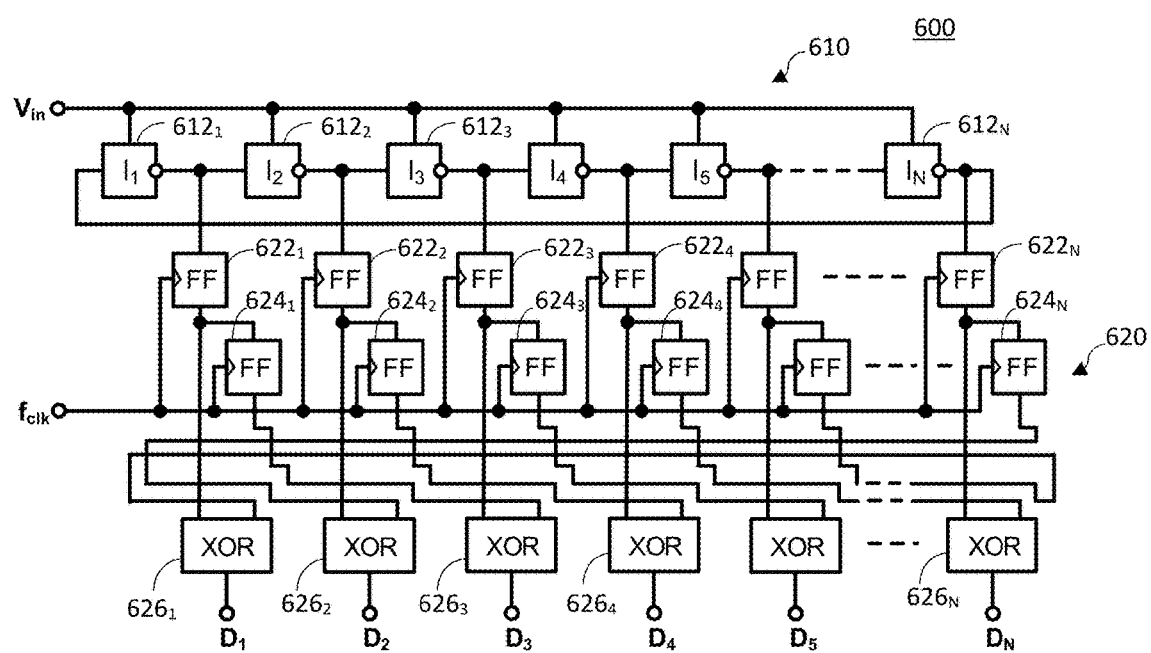
FIG. 8 shows an example of a ring oscillator-based ADC with a shift of 2.

The shift can be any value less than N (N being the number of stages of the ring oscillator). FIG. 8 shows another example of a ring oscillator-based ADC 600 with a shift of 2. The ring oscillator-based ADC 600 may be used as the ADC 120 in the sigma-delta ADC 100 in FIG. 1. In FIG. 8, a comparator $626_1$ is coupled to a flip-flop $622_1$ and a flip-flop $624_{N-1}$, a comparator $626_2$ is coupled to a flip-flop $622_2$ and a flip-flop $624_N$, a comparator $626_3$ is coupled to a flip-flop $622_3$ and a flip-flop $624_1$, a comparator $626_4$ is coupled to a flip-flop $622_4$ and a flip-flop $624_2$, and so on. For a shift of 2, two more transitions are needed to have the same number of "1s" at the output of the comparators $626_1$-$626_N$ compared to the case without the shift. This allows to use the VCO in a much more linear range. With even number of shifts, no additional inverters (such as the inverters $628_1$-$628_N$ in FIG. 6) are needed.

Figure 9:
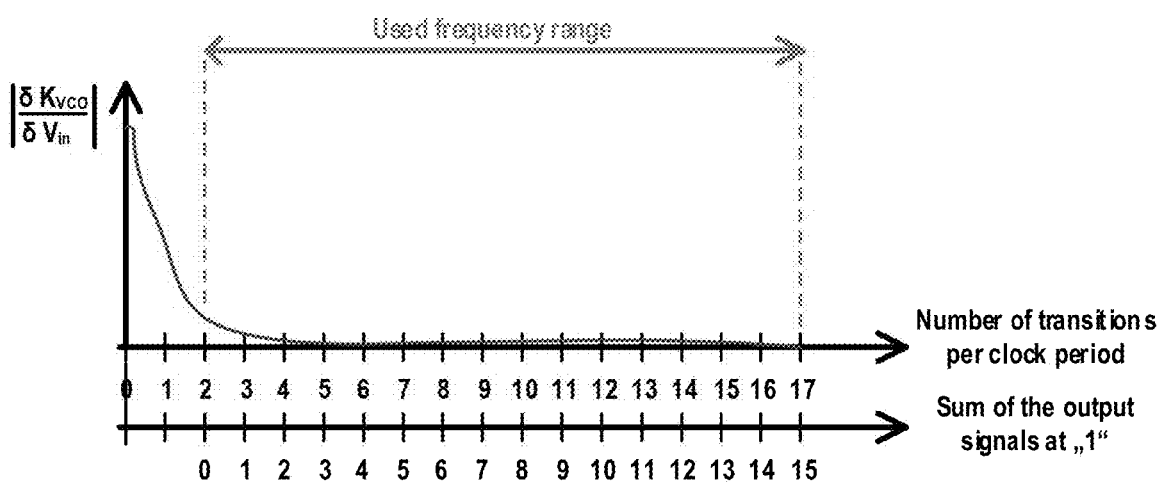
FIG. 9 shows a typical non-linearity behavior of the ring oscillator-based ADC of FIG. 8 with a shift of 2.

FIG. 9 shows a typical non-linearity behavior of the ring oscillator-based ADC 600 of FIG. 8 with a shift of 2. In this example, the used range of transitions per clock period $f_{clk}$ is between 2 and 17. As shown in FIG. 9, the linearity of the ring oscillator-based ADC is further improved.

The shift can be any value less than N (N being the number of stages of the ring oscillator) and with proper selection of the shift, the operating range of the ring oscillator can be moved to the optimal frequency range.

Figure 10:
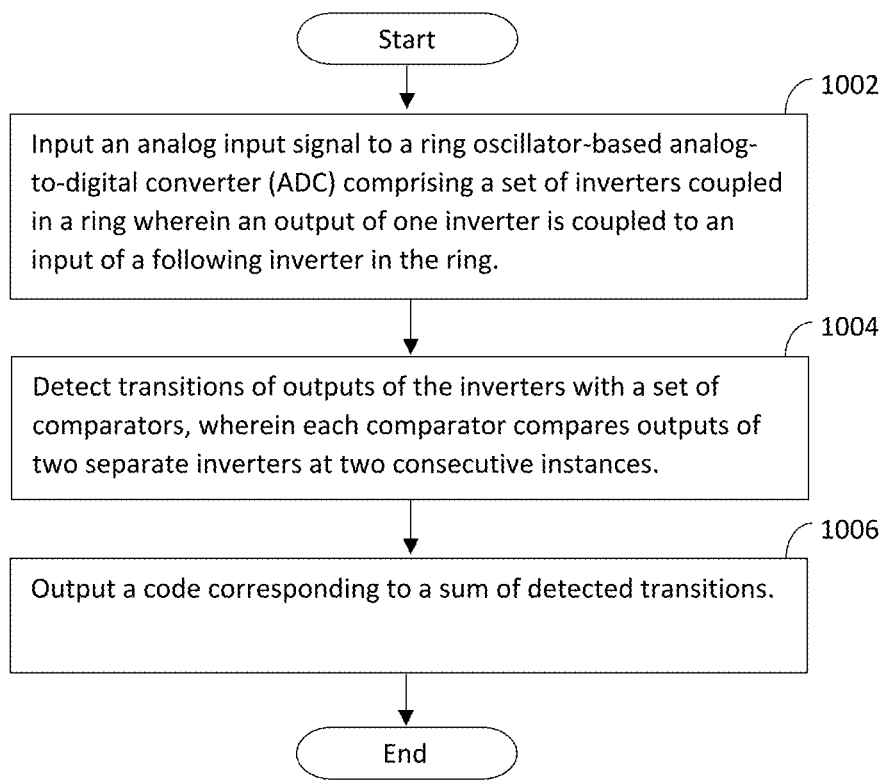
FIG. 10 is a flow diagram of an example process of converting an analog input signal to a digital signal in accordance with one example.

FIG. 10 is a flow diagram of an example process of converting an analog input signal to a digital signal in accordance with one example. An analog input signal is input to a ring oscillator-based ADC comprising a set of inverters coupled in a ring wherein an output of one inverter is coupled to an input of a successive inverter in the ring (1002). Transitions of outputs of the inverters are detected with a set of comparators (1004). Each comparator compares outputs of two separate inverters at two consecutive instances. A code corresponding to a sum of detected transitions is then output (1006).

Outputs of the set of inverters may be captured at two consecutive instances with two sets of registers, respectively, and each comparator may compare an output of one inverter at a first instance and an output of another inverter at a second instance. The two inverters whose outputs are compared by each comparator may be adjacent inverters in the ring. Alternatively, the two inverters whose outputs are compared by each comparator may be separated by more than one in the ring.

Figure 11:
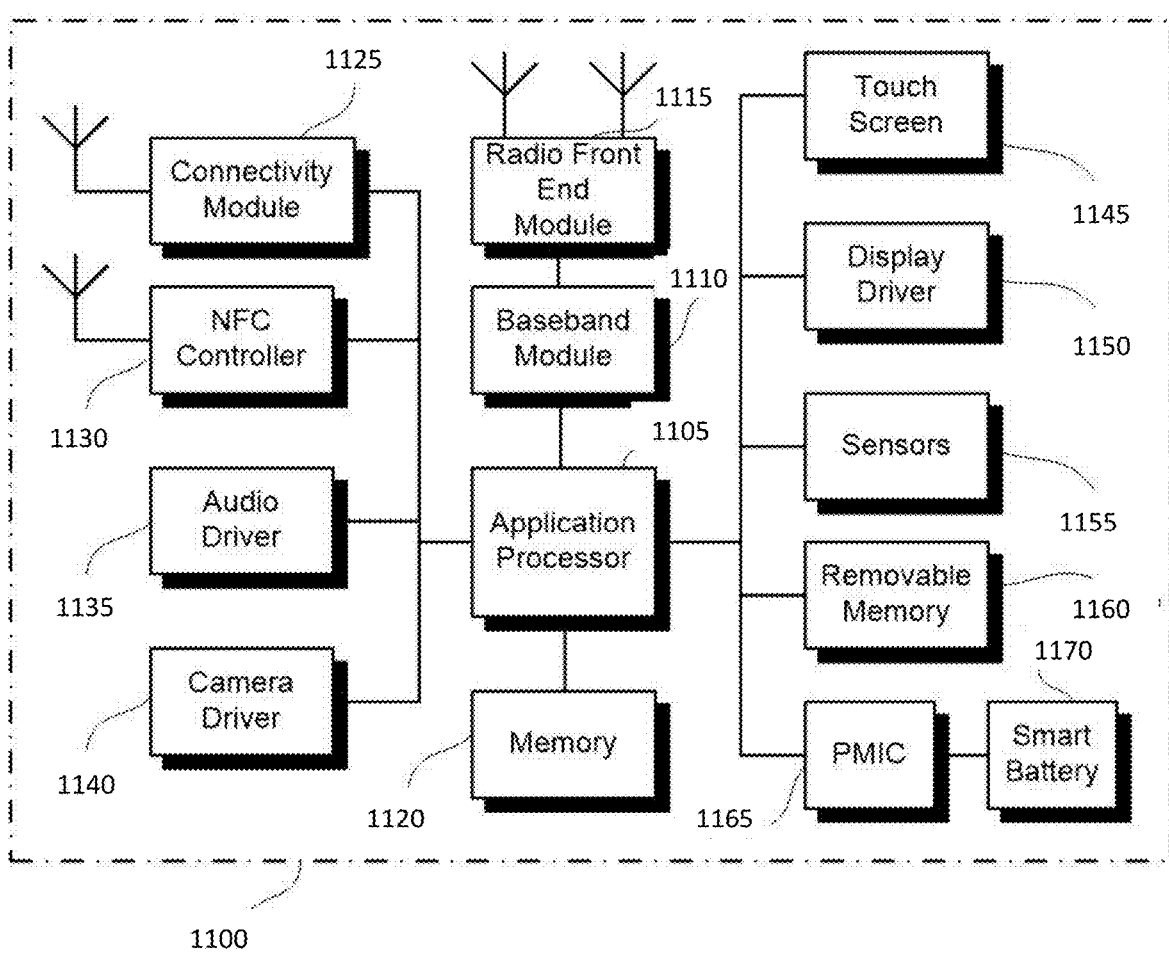
FIG. 11 illustrates a user device in which the examples disclosed herein may be implemented.

FIG. 11 illustrates a user device 1100 in which the examples disclosed herein may be implemented. For example, the examples disclosed herein may be implemented in the radio front-end module 1115, in the baseband module 1110, etc. The user device 1100 may be a mobile device in some aspects and includes an application processor 1105, baseband processor 1110 (also referred to as a baseband module), radio front end module (RFEM) 1115, memory 1120, connectivity module 1125, near field communication (NFC) controller 1130, audio driver 1135, camera driver 1140, touch screen 1145, display driver 1150, sensors 1155, removable memory 1160, power management integrated circuit (PMIC) 1165 and smart battery 1170.

In some aspects, application processor 1105 may include, for example, one or more CPU cores and one or more of cache memory, low drop-out voltage regulators (LDOs), interrupt controllers, serial interfaces such as serial peripheral interface (SPI), inter-integrated circuit ($I^2C$) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 1110 may be implemented, for example, as a solder-down substrate including one or more integrated circuits, a single packaged integrated circuit soldered to a main circuit board, and/or a multi-chip module containing two or more integrated circuits.

Figure 12:
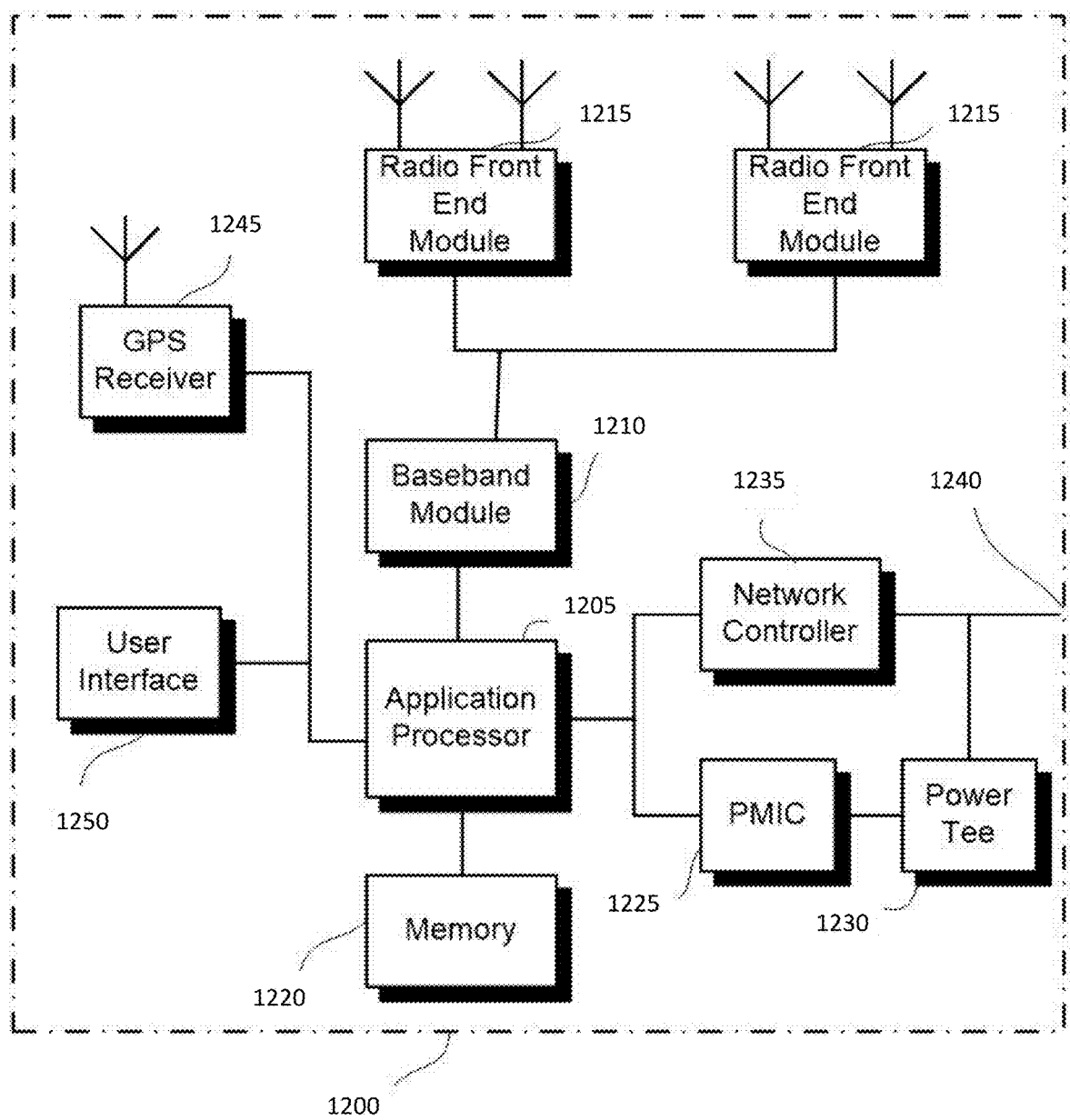
FIG. 12 illustrates a base station or infrastructure equipment radio head in which the examples disclosed herein may be implemented.

FIG. 12 illustrates a base station or infrastructure equipment radio head 1200 in which the examples disclosed herein may be implemented. For example, the examples disclosed herein may be implemented in the radio front-end module 1215, in the baseband module 1210, etc. The base station radio head 1200 may include one or more of application processor 1205, baseband modules 1210, one or more radio front end modules 1215, memory 1220, power management circuitry 1225, power tee circuitry 1230, network controller 1235, network interface connector 1240, satellite navigation receiver module 1245, and user interface 1250.

In some aspects, application processor 1205 may include one or more CPU cores and one or more of cache memory, low drop-out voltage regulators (LDOs), interrupt controllers, serial interfaces such as SPI, I$^2$C or universal programmable serial interface module, real time clock (RTC), timer-counters including interval and watchdog timers, general purpose TO, memory card controllers such as SD/MMC or similar, USB interfaces, MIPI interfaces and Joint Test Access Group (JTAG) test access ports.

In some aspects, baseband processor 1210 may be implemented, for example, as a solder-down substrate including one or more integrated circuits, a single packaged integrated circuit soldered to a main circuit board or a multi-chip module containing two or more integrated circuits.

In some aspects, memory 1220 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magneto resistive random access memory (MRAM) and/or a three-dimensional crosspoint memory. Memory 1220 may be implemented as one or more of solder down packaged integrated circuits, socketed memory modules and plug-in memory cards.

In some aspects, power management integrated circuitry 1225 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 1230 may provide for electrical power drawn from a network cable to provide both power supply and data connectivity to the base station radio head 1200 using a single cable.

In some aspects, network controller 1235 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 1245 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 1245 may provide data to application processor 1205 which may include one or more of position data or time data. Application processor 1205 may use time data to synchronize operations with other radio base stations.

In some aspects, user interface 1250 may include one or more of physical or virtual buttons, such as a reset button, one or more indicators such as light emitting diodes (LEDs) and a display screen.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples as described herein may be summarized as follows:

Example 1 is a ring oscillator-based ADC. The ring-oscillator-based ADC includes a ring oscillator including a plurality of inverters operably coupled in a ring wherein an output of an inverter is coupled to an input of a successive inverter in the ring, and a transition detector configured to detect transitions of outputs of the inverters by comparing outputs of two separate inverters at two consecutive time instances.

Example 2 is the ring oscillator-based ADC of example 1, wherein the transition detector includes two sets of registers configured to store outputs of the set of inverters at two consecutive time instances, respectively, and a set of comparators configured to compare the outputs stored in the two sets of registers, wherein each of the set of comparators is configured to compare an output of one of the plurality of inverters at a first time instance and an output of another of the plurality of inverters at a second time instance.

Example 3 is the ring oscillator-based ADC of example 2, wherein two inverters among the plurality of inverters whose outputs are compared by each of the set of comparators are separated by an odd number in the ring.

Example 4 is the ring oscillator-based ADC as in any one of examples 2-3, further including a set of output inverters, each of the set of output inverters being coupled to each of the set of comparators.

Example 5 is the ring oscillator-based ADC as in any one of examples 2-4, wherein the plurality of inverters are differential inverters generating outputs in two opposite polarities, and the two sets of registers are configured to store outputs of the plurality of inverters in opposite polarity.

Example 6 is the ring oscillator-based ADC as in any one of examples 2-5, wherein two inverters among the plurality of inverters whose outputs are compared by each of the set of comparators are separated by an even number in the ring.

Example 7 is the ring oscillator-based ADC as in any one of examples 2-6, wherein the registers are flip-flops.

Example 8 is the ring oscillator-based ADC as in any one of examples 2-7, wherein the comparators are exclusive OR gates.

Example 9 is the ring oscillator-based ADC as in any one of examples 1-8, wherein the inverters are digital inverters.

Example 10 is a sigma delta ADC. The sigma delta ADC includes a loop filter configured to filter an analog input signal to mitigate quantization errors in a band of interest, a ring oscillator-based ADC configured to convert an output of the loop filter to an n-bit digital signal, and a digital-to-analog converter configured to generate a feedback signal to be subtracted from the analog input signal based on the n-bit digital signal. The ring oscillator-based ADC includes a ring oscillator including a plurality of inverters coupled in a ring wherein an output of an inverter is coupled to an input of a successive inverter in the ring, and a transition detector configured to detect transitions of outputs of the inverters by comparing outputs of two inverters at two consecutive time instances.

Example 11 is the sigma delta ADC of example 10, wherein the transition detector includes two sets of registers configured to store outputs of the plurality of inverters at two consecutive time instances, respectively, and a set of comparators configured to compare the outputs stored in the two sets of registers, wherein each of the set of comparators is configured to compare an output of one of the plurality of inverters at a first time instance and an output of another of the plurality of inverters at a second time instance.

Example 12 is the sigma delta ADC of example 11, wherein two inverters among the plurality of inverters whose outputs are compared by each of the set of comparators are separated by an odd number in the ring.

Example 13 is the sigma delta ADC as in any one of examples 11-12, wherein the ring oscillator-based ADC further comprises a set of output inverters, each of the set of output inverters being coupled to each of the set of comparators.

Example 14 is the sigma delta ADC as in any one of examples 11-13, wherein the plurality of inverters are differential inverters, and the two sets of registers are configured to store outputs of the plurality of inverters in opposite polarity.

Example 15 is the sigma delta ADC as in any one of examples 11-14, wherein two inverters among the plurality of inverters whose outputs are compared by each of the set of comparators are separated by an even number in the ring.

Example 16 is the sigma delta ADC as in any one of examples 11-15, wherein the registers are flip-flops and the comparators are exclusive OR gates.

Example 17 is a method for converting an analog input signal to a digital signal. The method includes inputting an analog input signal to a ring oscillator-based ADC comprising a plurality of inverters operably coupled in a ring wherein an output of an inverter is coupled to an input of a successive inverter in the ring, detecting transitions of outputs of the inverters with a set of comparators, wherein each comparator compares outputs of two inverters at two consecutive time instances, and outputting a code corresponding to a sum of detected transitions.

Example 18 is the method of example 17, wherein outputs of the plurality of inverters are captured at two consecutive time instances with two sets of registers, respectively, and each of the set of comparators compares an output of one of the plurality of inverters at a first time instance and an output of another of the plurality of inverters at a second time instance.

Example 19 is the method as in any one of examples 17-18, wherein two inverters among the plurality of inverters whose outputs are compared by each of the set of comparators are adjacent inverters in the ring.

Example 20 is the method as in any one of examples 17-19, wherein two inverters among the plurality of inverters whose outputs are compared by each of the set of comparators are separated by more than one in the ring.

Example 21 is the method as in any one of examples 18-20, wherein the registers are flip-flops and the comparators are exclusive OR gates.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A ring oscillator-based analog-to-digital converter (ADC), comprising:
   a ring oscillator comprising a plurality of inverters operably coupled in a ring wherein an output of an inverter is coupled to an input of a successive inverter in the ring; and
   a transition detector configured to detect transitions of outputs of the inverters, wherein a transition of an output of each inverter is detected by comparing an output of each inverter and an output of another inverter that are obtained at two consecutive time instances.

2. The ring oscillator-based ADC of claim 1, wherein the transition detector comprises:
   two sets of registers configured to store outputs of the plurality of inverters at two consecutive time instances, respectively; and
   a set of comparators configured to compare the outputs stored in the two sets of registers, wherein each of the set of comparators is configured to compare an output of one inverter of the plurality of inverters at a first time instance and an output of another inverter of the plurality of inverters at a second time instance.

3. The ring oscillator-based ADC of claim 2, wherein two inverters among the plurality of inverters whose outputs are compared by each of the set of comparators are separated by an odd number in the ring.

4. The ring oscillator-based ADC of claim 3, further comprising a set of output inverters, each of the set of output inverters being coupled to each of the set of comparators.

5. The ring oscillator-based ADC of claim 3, wherein the plurality of inverters are differential inverters generating outputs in two opposite polarities, and the two sets of registers are configured to store outputs of the plurality of inverters in opposite polarity.

6. The ring oscillator-based ADC of claim 2, wherein two inverters among the plurality of inverters whose outputs are compared by each of the set of comparators are separated by an even number in the ring.

7. The ring oscillator-based ADC of claim 2, wherein the registers are flip-flops.

8. The ring oscillator-based ADC of claim 2, wherein the comparators are exclusive OR gates.

9. The ring oscillator-based ADC of claim 1, wherein the inverters are digital inverters.

10. A sigma delta analog-to-digital converter (ADC), comprising:
    a loop filter configured to filter an analog input signal to mitigate quantization errors in a band of interest;
    a ring oscillator-based ADC configured to convert an output of the loop filter to an n-bit digital signal; and
    a digital-to-analog converter configured to generate a feedback signal to be subtracted from the analog input signal based on the n-bit digital signal,
    wherein the ring oscillator-based ADC comprises:
    a ring oscillator comprising a plurality of inverters operably coupled in a ring wherein an output of an inverter is coupled to an input of a successive inverter in the ring; and
    a transition detector configured to detect transitions of outputs of the inverters, wherein a transition of output of each inverter is detected by comparing an output of each inverter and an output of another inverter that are obtained at two consecutive time instances.

11. The sigma delta ADC of claim 10, wherein the transition detector comprises:
    two sets of registers configured to store outputs of the plurality of inverters at two consecutive time instances, respectively; and
    a set of comparators configured to compare the outputs stored in the two sets of registers, wherein each of the set of comparators is configured to compare an output of one inverter of the plurality of inverters at a first time instance and an output of another inverter of the plurality of inverters at a second time instance.

12. The sigma delta ADC of claim 11, wherein two inverters among the plurality of inverters whose outputs are compared by each of the set of comparators are separated by an odd number in the ring.

13. The sigma delta ADC of claim 12, wherein the ring oscillator-based ADC further comprises a set of output inverters, each of the set of output inverters being coupled to each of the set of comparators.

14. The sigma delta ADC of claim 12, wherein the plurality of inverters are differential inverters, and the two sets of registers are configured to store outputs of the plurality of inverters in opposite polarity.

15. The sigma delta ADC of claim 11, wherein two inverters among the plurality of inverters whose outputs are compared by each of the set of comparators are separated by an even number in the ring.

16. The sigma delta ADC of claim 11, wherein the registers are flip-flops and the comparators are exclusive OR gates.

17. A method for converting an analog input signal to a digital signal, comprising:
    inputting an analog input signal to a ring oscillator-based analog-to-digital converter (ADC) comprising a plurality of inverters operably coupled in a ring wherein an output of an inverter is coupled to an input of a successive inverter in the ring;
    detecting transitions of outputs of the inverters with a set of comparators, wherein a transition of output of each inverter is detected by comparing an output of each inverter and an output of another inverter that are obtained at two consecutive time instances; and
    outputting a code corresponding to a sum of detected transitions.

18. The method of claim 17, wherein outputs of the plurality of inverters are captured at two consecutive time instances with two sets of registers, respectively, and each of the set of comparators compares an output of one inverter of the plurality of inverters at a first time instance and an output of another inverter of the plurality of inverters at a second time instance.

19. The method of claim 18, wherein the registers are flip-flops and the comparators are exclusive OR gates.

20. The method of claim 17, wherein two inverters among the plurality of inverters whose outputs are compared by each of the set of comparators are adjacent inverters in the ring.

21. The method of claim 17, wherein two inverters among the plurality of inverters whose outputs are compared by each of the set of comparators are separated by more than one in the ring.

\* \* \* \* \*